United States Patent
Ye et al.

(10) Patent No.: US 6,916,742 B2
(45) Date of Patent: Jul. 12, 2005

(54) MODULAR BARRIER REMOVAL POLISHING SLURRY

(75) Inventors: Qianqiu Ye, Wilmington, DE (US); Matthew VanHanehem, Bear, DE (US); John Quanci, Haddonfield, NJ (US)

(73) Assignee: Rohm and Haas Electronic Materials CMP Holdings, Inc., Wilmington, DE (US)

( * ) Notice: Subject to any disclaimer, the term of this patent is extended or adjusted under 35 U.S.C. 154(b) by 0 days.

(21) Appl. No.: 10/376,059

(22) Filed: Feb. 27, 2003

(65) Prior Publication Data

US 2004/0171265 A1 Sep. 2, 2004

(51) Int. Cl.$^7$ .......................... H01L 21/302; B24B 1/00; C09K 1/68
(52) U.S. Cl. .......................... 438/692; 438/693; 451/36; 51/309
(58) Field of Search .......................... 438/692, 693; 451/36; 51/309

(56) References Cited

U.S. PATENT DOCUMENTS

| | | | |
|---|---|---|---|
| 4,154,610 A | * | 5/1979 | Katoh .......................... 430/236 |
| 6,328,634 B1 | | 12/2001 | Shen et al |
| 6,348,076 B1 | * | 2/2002 | Canaperi et al. ............ 51/309 . |
| 6,443,812 B1 | | 9/2002 | Costas et al. |
| 6,468,911 B1 | * | 10/2002 | Miyashita et al. ........... 438/692 |
| 2001/0024933 A1 | | 9/2001 | Sachan et al. |
| 2002/0019202 A1 | | 2/2002 | Thomas et al. |
| 2002/0132563 A1 | | 9/2002 | Luo et al. |
| 2002/0146965 A1 | | 10/2002 | Thomas et al. |
| 2004/0014400 A1 | * | 1/2004 | Cherian et al. ................ 451/41 |

FOREIGN PATENT DOCUMENTS

| | | |
|---|---|---|
| EP | 0 846 740 A | 6/1998 |
| WO | WO 99/64527 A1 | 12/1999 |
| WO | WO 00/36037 A1 | 6/2000 |
| WO | WO 01/14496 A1 | 3/2001 |
| WO | WO 01/19935 A1 | 3/2001 |

OTHER PUBLICATIONS

U.S. Appl. No. 09/420,682, Sachan et al.

* cited by examiner

*Primary Examiner*—Long Pham
*Assistant Examiner*—Shrinivas H. Rao
(74) *Attorney, Agent, or Firm*—Blake T. Biederman

(57) ABSTRACT

An aqueous slurry is useful for chemical mechanical planarizing a semiconductor substrate. The slurry includes by weight percent, 0.1 to 25 oxidizing agent, 0.1 to 20 silica particles having an average particle size of less than 200 nm, 0.005 to 0.8 polyvinyl pyrrolidone for coating the silica particles, 0.01 to 10 inhibitor, 0.001 to 10 complexing agent and a balance water and incidental impurities; and the aqueous slurry having a pH of at least 7.

16 Claims, 3 Drawing Sheets

PVP effect on RR

MODULAR BARRIER REMOVAL POLISHING SLURRY

BACKGROUND OF THE INVENTION

The introduction of new low-k and ultra-low-k dielectrics into chip manufacturing poses new challenges for chemical mechanical planarization (CMP). Since the mechanical strength of low-k and ultra-low-k materials is relatively low, the mechanical force applied during CMP can fracture or delaminate low-k films from wafer substrates. Consequently, CMP is moving towards employing its polishing equipment with lower down forces, i.e. forces of or less than 3 psi (20.7 kPa). Operating the polishing equipment with lower down forces requires the polishing slurries to possess an increased removal rate to facilitate acceptable wafer throughput rates.

Another challenge facing slurry manufacturers is that the current low-k/ultra-low-k integration architectures are extremely diverse and largely depend on user-specific targets. Some relatively simple integration schemes will use conventional CMP slurries that have a low selectivity to the dielectric material. Although these slurries have good topography correction capabilities, they tend to induce excessive dielectric and metal losses. In addition to this issue, because of the higher aspect ratio of the metallized trench/via structures, some integration schemes will require higher selective slurries for decreased metal losses during barrier CMP. Furthermore, the potential for including capping layers of different films in integration schemes provides an extra level of complexity.

In addition to the difficulties arising from complex integration schemes, most ultra-low-k materials are porous and prone to slurry contamination. Depositing a porous capping layer on top of the porous dielectric prevents the slurry from contaminating the low-k film. In addition to this, current ultra-low-k integration schemes may contain multiple capping layers. For example, many ultra-low-k integration schemes employ two capping layers, a top sacrificial layer and an underlying bottom cap that protects the dielectric. For these two capping layer schemes, barrier low-k slurries must remove the barrier, maintain or correct topography from the previous steps, remove a sacrificial top capping layer and maintain the bottom capping layer with no "punch-through" to the underlying ultra-low-k. This requires selectivity control between several different films, barrier layers, one and possibly two capping materials, interconnect metals such as copper, and low-k dielectric films. Consequently, there is a demand for a slurry having the ability to control the selectivity between the barriers, dielectric, Cu films, and capping layers.

STATEMENT OF THE INVENTION

The invention provides an aqueous slurry useful for chemical mechanical planarizing a semiconductor substrate comprising by weight percent, 0.1 to 25 oxidizing agent, 0.1 to 20 silica particles having an average particle size of less than 200 nm, 0.005 to 0.8 polyvinyl pyrrolidone for coating the silica particles, 0.01 to 10 inhibitor for decreasing removal rate of at least one nonferrous metal, 0.001 to 10 complexing agent for the nonferrous metal and a balance water and incidental impurities; and the aqueous slurry having a pH of at least 7.

The method of polishing a semiconductor substrate comprises the steps of: a) applying the slurry of claim 1 to the semiconductor substrate; b) placing 21 kPa or less downward force to a polishing pad, the downward force being against the semiconductor substrate; and c) planarizing the semiconductor substrate with the polishing pad to remove a barrier material from the semiconductor substrate.

DETAILED DESCRIPTION

Figure 1:
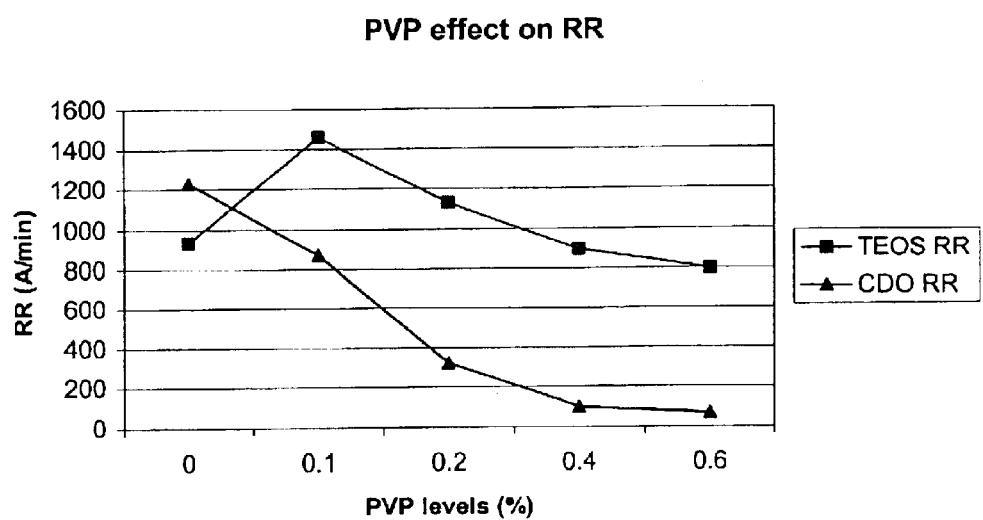
FIG. 1 is a plot of TEOS and CSO (low-k) removal rates versus polyvinyl pyrrolidone (PVP).

It has been discovered that adding a controlled amount of polyvinyl pyrrolidone or PVP to a silica-containing slurry provides excellent control for selective removal rates of low-k dielectric films. Specifically, PVP additions to silica CMP slurries provide an ability to polish both low-k dielectric films (typically, hydrophobic) and hard mask capping layer films.

The polishing slurry contains 0.1 to 25 weight percent oxidizing agent. The oxidizing agent is for oxidizing a metal constituent of the wafer, such as copper. The specification reports all concentrations in weight percent. Advantageously, the slurry contains 0.1 to 10 weight percent oxidizing agent. Most advantageously, the slurry contains 0.5 to 7.5 weight percent oxidizing agent. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, Cu salts, chromium salts, cobalt salts, halogens and hypochlorites. Furthermore, it is often advantageous to use a mixture of oxidizer compounds. The preferred barrier metal polishing slurry includes a hydrogen peroxide oxidizing agent. When the polishing slurry contains an unstable oxidizing agent such as, hydrogen peroxide, it is often most advantageous to mix the oxidizer into the slurry at the point of use.

The slurry contains 0.1 to 20 weight percent colloidal silica abrasive for removing barrier materials. Advantageously the slurry contains 0.1 to 15 weight percent colloidal silica abrasive. The colloidal silica has an average particle size of less than 200 nm. Advantageously, the colloidal silica has an average particle size of 5 to 150 nm in the aqueous slurry. Most advantageously, the colloidal silica has an average particle size of 6 to 120 nm. Typically, increasing particle size will increase barrier removal rate. But increasing the colloidal silica particle size also tends to increase the slurry's scratching of semiconductor wafers. In addition to the silica particles' size, the particles' shape and morphology can also have an effect on scratching.

The slurry also contains 0.005 to 0.8 weight percent polyvinyl pyrrolidone (PVP) for coating the silica particles. For purposes of the specification, coating the silica particles defines the PVP having a measurable impact of the slurry's zeta potential. For example, a measurable impact on zeta potential occurs when there is a detectable difference in zeta potential for a slurry with and without the PVP. A particular device acceptable for measuring zeta potential is the DT-1200 by Dispersion Technology. Advantageously, the slurry contains 0.05 to 0.8 weight percent PVP. For applications demanding barrier removal with a modest low-k removal rate, the slurry advantageously contains 0.05 to 0.4 weight percent PVP. For applications demanding barrier removal with a low low-k removal rate, the slurry advantageously contains 0.4 to 0.8 weight percent PVP.

Advantageously, the PVP provides at least a 2 millivolt increase in zeta potential to the slurry. Although increasing the zeta potential decreases the slurries' stability, it also decreases the slurries' low-k removal rate. Most advantageously, the slurries' PVP provides at least a 5 millivolt increase in zeta potential. Excess PVP, however, may result in irreversible precipitation of the colloidal silica. For purposes of this specification, irreversible precipitation is silica that remains precipitated after two minutes of stirring in the aqueous solution. Advantageously, the PVP results in less than 10 percent of the silica undergoing irreversible precipitation during storing the slurry at room temperature for at least thirty days. Most advantageously, the PVP results in less than 2 percent of the silica undergoing irreversible precipitation during storing the slurry at room temperature for at least thirty days. Typically, reducing irreversible silica precipitation reduces the slurries' scratching tendency.

An addition of 0.01 to 10 total weight percent inhibitor decreases removal rate of a nonferrous metal, such as copper, silver, copper-base alloys and silver-base alloys. Most advantageously, the semiconductor wafer includes copper. Advantageously, the inhibitor includes an azole. Azole inhibitors include benzotriazole (BTA), tolytriazole, imidazole and other azole compounds. Most advantageously the slurry contains 0.01 to 5 total weight percent azole inhibitor.

The aqueous slurry has a pH of at least 7 for removing the barrier material. The slurry is particularly effective at removing tantalum, tantalum nitride, titanium, titanium nitride and other barrier materials. Most advantageously, the slurry has a pH between 7.5 and 12. A source of hydroxy ions, such as ammonia, sodium hydroxide or potassium hydroxide adjusts the pH in the basic region. Most advantageously, the source of hydroxy ions is potassium hydroxide.

In addition to the inhibitor, 0.001 to 10 weight percent complexing agent prevents precipitation of nonferrous metals. Most advantageously, the slurry contains 0.001 to 5 weight percent complexing agent. Example complexing agents include acetic acid, citric acid, ethyl acetoacetate, glycolic acid, lactic acid, malic acid, oxalic acid, saliclylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, and salts thereof. Advantageously, the complexing agent is selected from the group consisting of acetic acid, citric acid, ethyl acetoacetate, glycolic acid, lactic acid, malic acid, oxalic acid. Most advantageously, the complexing agent is citric acid.

Optionally, the slurry may contain leveling agents such as chlorides or in particular, ammonium chloride, buffers, dispersion agents and surfactants. Ammonium chloride provides an improvement in surface appearance.

Advantageously, the slurry polishes a semiconductor substrate by applying the slurry to a semiconductor substrate by placing 21 kPa or less downward force on a polishing pad. The downward force represents the force of the polishing pad against the semiconductor substrate. The polishing pad may have a circular shape, a belt shape or a web configuration. This low downward force is particularly useful for planarizing the semiconductor substrate to remove a barrier material from the semiconductor substrate. Most advantageously, the polishing occurs with a downward force of less than 15 kPa.

The planarizing can remove TEOS from the semiconductor substrate at a removal rate of at least five times greater that the removal rate of low-k dielectric materials from the semiconductor substrate. For some formulations, the planarizing can remove TEOS from the semiconductor substrate at a removal rate of at least ten times greater that the removal rate of low-k dielectric materials from the semiconductor substrate. In addition to this, the planarizing can remove SiC barrier from the semiconductor substrate at a removal rate greater than the removal rate of low-k dielectric materials from the semiconductor substrate.

EXAMPLES

All tests employed 200 mm wafers. These wafers included TEOS silicon dioxide, silicon nitride, silicon carbide, carbon doped oxide (CDO), tantalum nitride, tantalum and electroplated copper sheet wafers for determining sheet wafer removal rates. The low-k dielectric was a CORAL CDO supplied by Novellus. In addition, topographical data collection data resulted from testing International Sematech, MIT 854-AZ patterned wafers using either Rodel® standard IC1010™ polyurethane polishing pads containing a micro-porous structure or Politex® Hi Embossed pads. Applied Materials' MIRRA® CMP device provided the polishing platform.

The first step polishing consisted of Eternal's EPL2360 polishing slurry with an IC1010 pad on platen 1 and Rodel's RLS3126 reactive liquid (an acidic-abrasive-free solution) with an IC1010 pad on platen 2 for all patterned wafers. The second step barrier layer polishing on platen 3 employed either the Rodel Politex Hi Embossed or IC1010 polishing pads. And the process had a down force of either 2 psi (13.8 kPa) or 3 psi (20.7 kPa) with both platen and carrier speeds indexed to 120 and 114 rpm respectively—the slurry flow rate was set at 180 ml/min.

Measuring the pre-and post-polish film thickness provided the basis for calculating removal rates. A KLA-Tencor SM300 or ThermaWave Optiprobe 2600 determined thickness of dielectric films optically transparent in the visible electromagnetic regime such as, PECVD TEOS $SiO_2$, silicon carbide and silicon nitride. A Four-Point Probe CDE Resmap Thickness measured thickness of conductive films such as tantalum nitride, tantalum, and copper. Finally, a Dektak Veeco V200SL collected patterned wafer topography data. Zeta potential measurements reflect value obtained with a DT-1200 device by Dispersion Technology. This specification reports all removal rates in units of Å/min.

The following Table provides the chemistries for the polishing slurries tested by weight percent. Slurries designated with letter represent comparative slurries and slurries designated with numerals represent slurries of the invention.

TABLE 1

| Slurry | Citric acid | Ammonium Chloride | PVP | BTA | Silica | $H_2O_2$ | pH |
|---|---|---|---|---|---|---|---|
| A | 0.3 | 0.01 | 0 | 0.05 | 12 | 0.8 | 9 |
| B | 0.3 | 0.01 | 0 | 0.05 | 8.5 | 0.8 | 9 |
| C | 0.3 | 0.01 | 1.0 | 0.05 | 12 | 0.8 | 9 |
| D | 0.3 | 0.01 | 1.0 | 0.05 | 8.5 | 0.8 | 9 |
| E | 0 | 0 | 0.1 | 0 | 30 | 0 | 9 |
| F | 0 | 0 | 0.2 | 0 | 30 | 0 | 9 |
| G | 0 | 0 | 0.3 | 0 | 30 | 0 | 9 |
| H | 0 | 0 | 0.4 | 0 | 30 | 0 | 9 |
| I | 0 | 0 | 0.5 | 0 | 30 | 0 | 9 |
| J | 0 | 0 | 0.8 | 0 | 30 | 0 | 9 |
| K | 0 | 0 | 1.0 | 0 | 30 | 0 | 9 |
| 1 | 0.3 | 0.01 | 0.1 | 0.05 | 12 | 0.8 | 9 |
| 2 | 0.3 | 0.01 | 0.2 | 0.05 | 12 | 0.8 | 9 |
| 3 | 0.3 | 0.01 | 0.3 | 0.05 | 12 | 0.8 | 9 |
| 4 | 0.3 | 0.01 | 0.4 | 0.05 | 12 | 0.8 | 9 |
| 5 | 0.3 | 0.01 | 0.5 | 0.05 | 12 | 0.8 | 9 |
| 6 | 0.3 | 0.01 | 0.6 | 0.05 | 12 | 0.8 | 9 |
| 7 | 0.3 | 0.01 | 0.8 | 0.05 | 12 | 0.8 | 9 |
| 8 | 0.3 | 0.01 | 0.2 | 0.05 | 8.5 | 0.8 | 9 |
| 9 | 0.3 | 0.01 | 0.3 | 0.05 | 8.5 | 0.8 | 9 |
| 10 | 0.3 | 0.01 | 0.5 | 0.05 | 8.5 | 0.8 | 9 |
| 11 | 0.3 | 0.01 | 0.6 | 0.05 | 8.5 | 0.8 | 9 |
| 12 | 0.3 | 0.01 | 0.8 | 0.05 | 8.5 | 0.8 | 9 |

Example 1

The following Table illustrates the impact on removal rates with a 3 psi (20.7 kPa) down force for various semiconductor constituents.

TABLE 2

| Slurry | PVP(%) | TEOS RR | CDO RR | Cu RR | TaN RR |
|---|---|---|---|---|---|
| A | 0 | 933 | 1227 | 87 | 1020 |
| 1 | 0.1 | 1457 | 867 | 241 | 1421 |
| 2 | 0.2 | 1294 | 347 | 70 | 1190 |
| 4 | 0.4 | 895 | 100 | 294 | 1040 |
| 6 | 0.6 | 795 | 67 | 324 | 1007 |

RR = Removal Rate

The addition of PVP, as plotted in FIG. 1, shows that the CMP polishing process removes both TEOS (capping material) and low K materials (CDO) for slurries lacking PVP. But adding PVP to the slurry, however, allows the slurry to selectively remove TEOS film in relation to low-k films. Therefore, this formulation allows chip fabricators to provide chemical mechanical planarization and stop on a low-k film. For example, some dual hard mask/cap integration schemes will require removing a TEOS cap while stopping on a SiC or CDO layer. For these integration schemes, slurry 4 that has a high TEOS removal rate and stops on SiC provides an excellent solution.

Example 2

The following Table confirms the effects of PVP for SiC wafers and illustrates the effect arising from decreasing down force to 2 psi (13.8 kPa).

TABLE 3

| Slurry | PVP(%) | TEOS RR | SIC RR* | TaN RR | CDO RR |
|---|---|---|---|---|---|
| A | 0 | 551 | 557 | 945 | 833 |
| 1 | 0.1 | 738 | 697 | 1237 | 585 |
| 2 | 0.2 | 615 | 393 | 1025 | 263 |
| 4 | 0.4 | 502 | 163 | 996 | 69 |
| 6 | 0.6 | 438 | 90 | 1017 | 40 |

RR = Removal Rate

Figure 2:
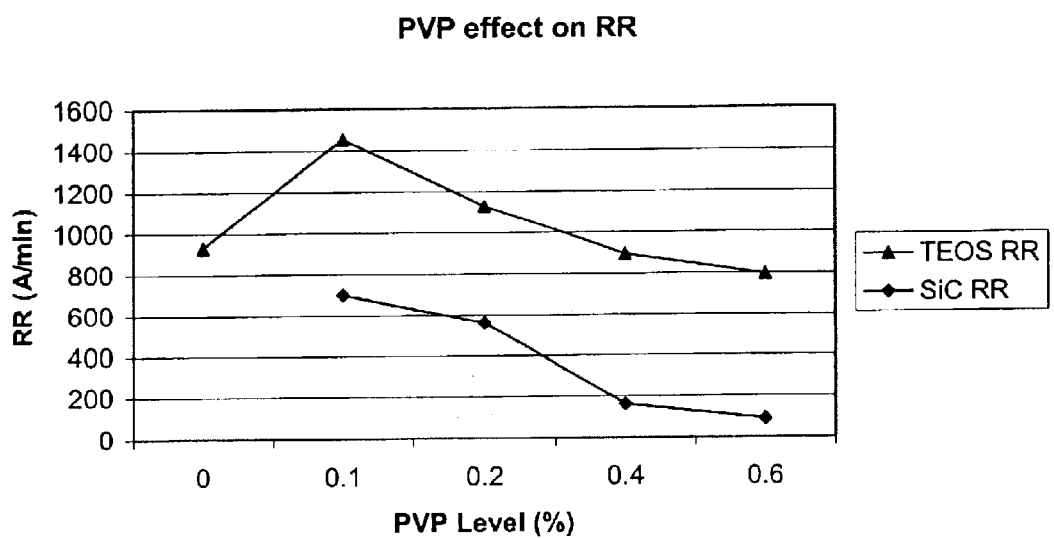
FIG. 2 is a plot of TEOS and silicon carbide removal rates versus polyvinyl pyrrolidone (PVP).

As observed in Example 1, CDO removal rate decreased with the increase of PVP in slurry. In addition to this, as illustrated in FIG. 2, the PVP addition also decreased the SiC removal rate. Because of the relative hardness of SiC to CDO, the SiC removal rate is typically much lower than the CDO removal rate for most polishing slurries. But the PVP-containing solutions showed generally higher SiC removal rates than CDO removal rates.

Example 3

The following series evaluates the solid concentration effect for slurries having 8.5 weight percent silica on the SiC and CDO wafers with a 2 psi (13.8 kPa) down force.

TABLE 4

| Slurry | PVP(%) | TEOS RR | SIC RR | TaN RR | CDO RR |
|---|---|---|---|---|---|
| B | 0 | 410 | 386 | 694 | 579 |
| 8 | 0.2 | 375 | 215 | 902 | 150 |
| 11 | 0.6 | 297 | 62 | 807 | 39 |

RR = Removal Rate

Figure 3:
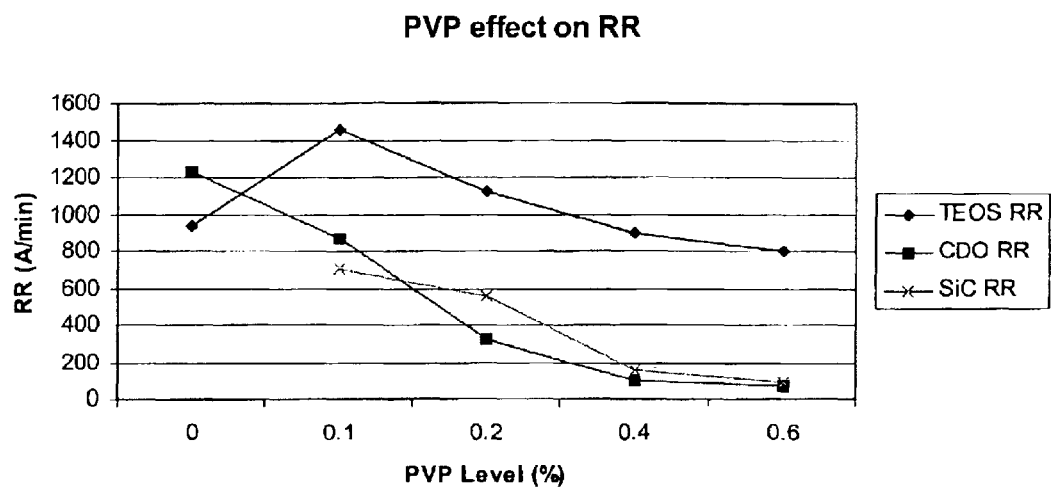
FIG. 3 is a plot of TEOS, silicon carbide and CDO (low-k) removal rates versus polyvinyl pyrrolidone (PVP).

As observed in the earlier Examples, PVP lowered the CDO and SiC removal rates. FIG. 3 illustrates the dramatic effect on low-k removal rates achieved for the slurries of Table 4.

Example 4

Surface property is another important characteristic affecting low-k film polishing. Specifically, low-k dielectrics that form a hydrophobic surface are difficult to clean. But PVP in the slurry also appears to modify hydrophobic low-k surfaces from hydrophobic to hydrophilic for improved cleaning. This also provides a significant advantage to the slurry's performance by eliminating the need for surface modifying surfactants. The PVP addition appears to reduce or eliminate the requirement to add such surface modification chemicals to the slurry; and reducing the slurry's surfactant demand improves the slurry's stability. Table 5 provides wet testing results for slurries with and without PVP.

TABLE 5

| Formulation | SiCOH surface |
|---|---|
| 2 (0.2% PVP) | Hydrophilic-wet |
| A (0 PVP) | Hydrophobic-dry |

Figure 4:
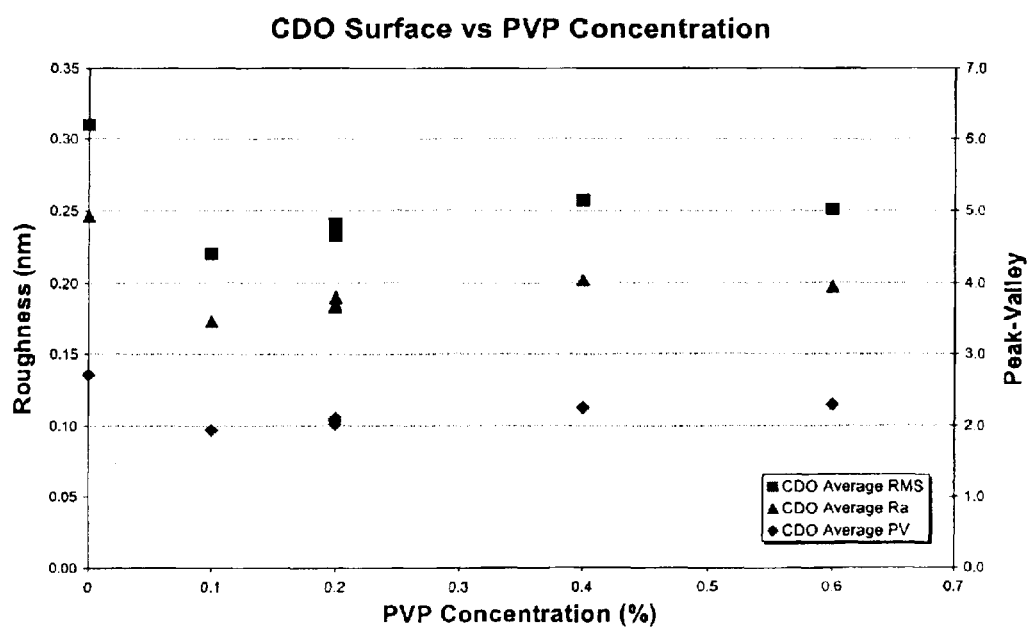
FIG. 4 is a plot of CDO (low-k) roughness versus polyvinyl pyrrolidone (PVP).
Figure 5:
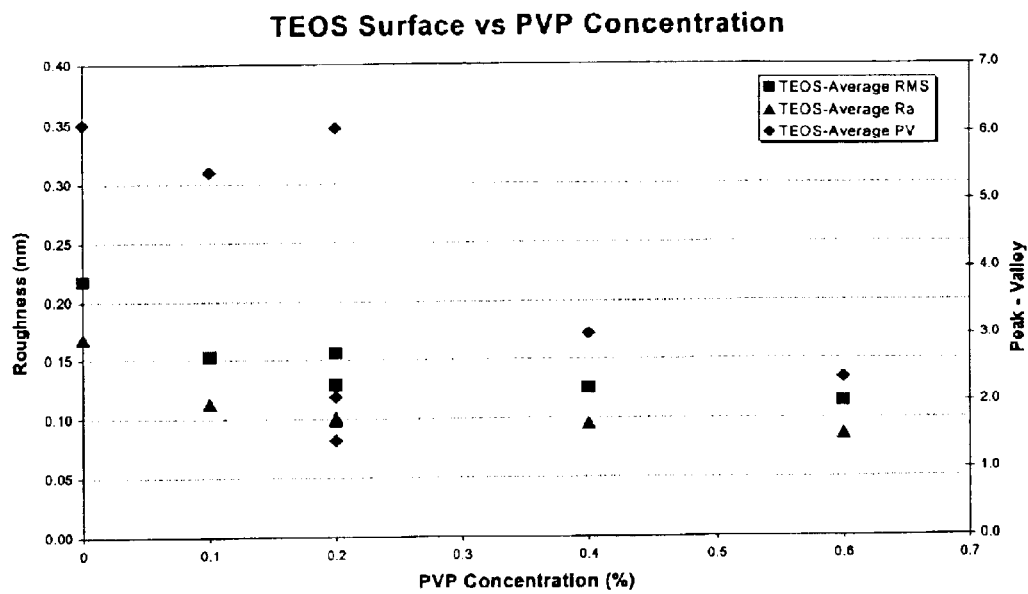
FIG. 5 is a plot of TEOS roughness versus polyvinyl pyrrolidone (PVP).

FIG. 4 illustrates that without PVP, the CDO wafer's surface is not as smooth as that achieved with PVP-containing slurries. FIG. 5 illustrates that the PVP addition also improved the TEOS wafer's surface quality. In addition to this, increasing the TEOS above 0.1 weight percent provided an additional improvement in the TEOS wafers' surface finish. The impact of PVP-containing slurries on the copper wafers' surface quality, however, was inconsistent and of little, if any, benefit.

Example 5

Figure 6:
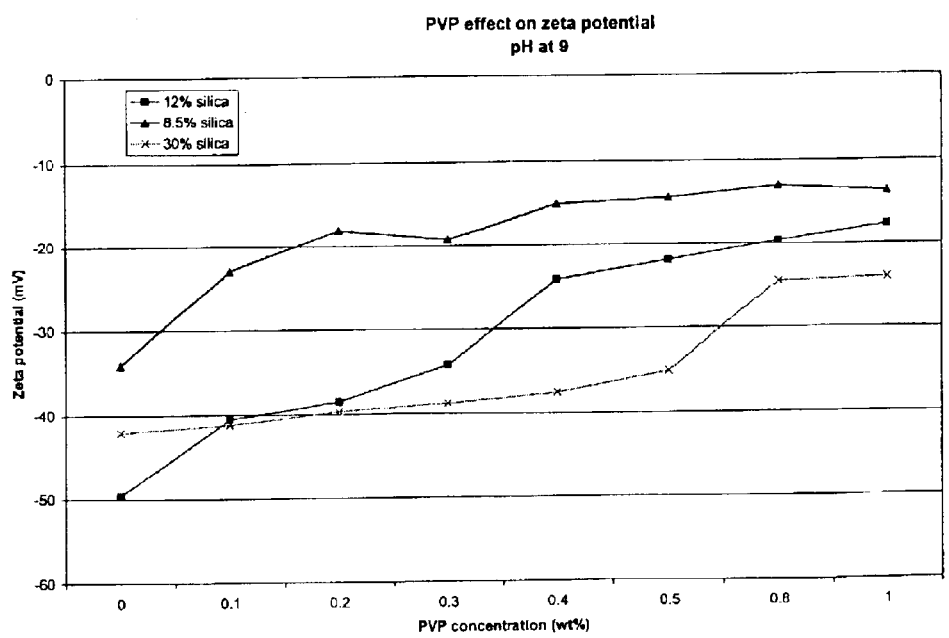
FIG. 6 is a plot of zeta potential versus polyvinyl pyrrolidone (PVP) for three different slurries.

This experiment compares the effect of PVP on zeta potential for slurries containing 8.5 wt. % silica (B, D and 8 to 12), 12 wt. % silica (A, C and 1 to 7) and a pure silica slurry containing 30 wt. % silica (Klebosol 1498 of E to K). FIG. 6 plots the dramatic increase in zeta potential achieved with minimal concentrations of PVP. In addition, this Figure, illustrates the shift in zeta potential associated with slurry composition.

The modular barrier removal rate slurries facilitate adjustment of the relative removal rates of copper, capping layers and dielectric films for optimizing final wafer topography. This provides an efficacy of enabling a selective removal control between several different films including, barrier, copper, low-k and hardmask/capping dielectric films. Consequently, the selectivity control between these films can satisfy multiple integration schemes and requirements. For example, the data show that barrier removal slurries can have a selectivity for TEOS:CDO of 10 to 1 and greater.

The PVP-containing slurries are effective with Low-K wafers and particularly effective for integration scheme that require removing a capping film (TEOS) but stopping at a SiC or CDO film. For example, the slurry provides a high-selectivity slurry designed for maintaining a wafer's topography after a barrier clear and allows for long overpolish times with a minimal ILD loss. The slurry facilitates minimal low-k or cap removal with polymeric polishing pads and in particular micro-porous polyurethane pads. The slurry provides a medium-selectivity slurry recommended for a dual-top hardmask integration schemes. These integration schemes require complete removal of the top hardmask and minimal removal of the bottom hardmask. The low-selectivity slurry operates with architectures that require topography correction and planarization of the low-k material using either Politex or IC1010 polishing pads. Unfortunately, using this low-selectivity slurry may result in a higher ILD loss.

In summary, the modular barrier removal slurry provides relative removal rate adjustability for copper or silver, dielectric materials and caps to optimize wafer's final topography and dielectric/metal loss for specific integration schemes. In addition, the high barrier removal rates facilitate a high wafer throughput. Furthermore, the wafer can achieve significant reductions in topography during the barrier removal step without compromising dielectric loss; and the formulations afford low defectivity and excellent surface quality. And finally, the modular barrier removal slurries facilitate modeling to predict the best slurry to meet an integration scheme and with ample selectivity regarding TEOS/SiC and TEOS/CDO to planarize both low-k capped and uncapped patterned wafers.

We claim:

1. An aqueous slurry useful for chemical mechanical planarizing a semiconductor substrate comprising by weight percent, 0.1 to 25 oxidizing agent, 0.1 to 20 silica particles having an average particle size of less than 200 nm, 0.005 to 0.8 polyvinyl pyrrolidone (PVP) for coating the silica particles to increase the zeta potential at least 2 millivolts, 0.01 to 10 inhibitor for decreasing removal rate of at least one nonferrous metal, 0.001 to 10 complexing agent for the nonferrous metal and a balance water and incidental impurities; and the aqueous slurry having a pH of 7 to 12.

2. The aqueous slurry of claim 1 wherein the PVP in the amount of 0.005 to 0.8 weight percent increases the zeta potential at least 5 millivolts.

3. The aqueous slurry of claim 1 wherein the added PVP results in less than 10 percent of the silica particles undergoing irreversible precipitation during storing the slurry at room temperature for at least thirty days.

4. An aqueous slurry useful for chemical mechanical planarizing a semiconductor substrate comprising by weight percent, 0.1 to 10 oxidizing agent, 0.1 to 15 silica particles having an average particle size of 5 to 150 nm, 0.05 to 0.8 polyvinyl pyrrolidone (PVP) for coating the silica particles to increase the zeta potential at least 2 millivolts, 0.01 to 5 total azole inhibitor for decreasing removal rate of at least one nonferrous metal, 0.001 to 5 complexing agent for the nonferrous metal and a balance water and incidental impurities; and the aqueous slurry having a pH of 7.5 to 12.

5. The aqueous slurry of claim 4 wherein the PVP in the amount of 0.05 to 0.8 weight percent increases the zeta potential at least 5 millivolts and less than 10 percent of the added PVP results in silica particles undergoing irreversible precipitate ion during storing the slurry at room temperature for at least thirty days.

6. The aqueous slurry of claim 4 wherein the PVP concentration is between 0.05 and 0.4 weight percent.

7. The aqueous slurry of claim 4 wherein the PVP concentration is between 0.4 and 0.8 weight percent.

8. An aqueous slurry useful for chemical mechanical planarizing a semiconductor substrate comprising by weight percent, 0.5 to 7.5 oxidizing agent, 0.1 to 15 silica particles having an average particle size of 6 to 120 nm, 0.05 to 0.8 polyvinyl pyrrolidone (PVP) for coating the silica particles to increase the zeta potential at least 2 millivolts, 0.01 to 5 total azole inhibitor for decreasing removal rate of at least one nonferrous metal, 0.001 to 5 complexing agent for the nonferrous metal and a balance water and incidental impurities; and the aqueous slurry having a pH of 7.5 to 12.

9. The aqueous slurry of claim 8 wherein the added PVP results in less than 10 percent of the silica particles undergoing irreversible precipitation during storing the slurry at room temperature for at least thirty days.

10. The aqueous slurry of claim 8 wherein the PVP concentration is between 0.05 and 0.4 weight percent.

11. The aqueous slurry of claim 10 wherein the PVP in the amount of 0.05 to 0.4 weight percent increase the zeta potential at least 5 millivolts.

12. The aqueous slurry of claim 8 wherein the PVP concentration is between 0.4 and 0.8 weight percent.

13. The aqueous slurry of claim 12 wherein the PVP in the amount of 0.4 to 0.8 weight percent increases the zeta potential at least 5 millivolts.

14. The aqueous slurry of claim 8 wherein the complexing agent comprises at least one of acetic acid, citric acid, ethyl acetoacetate, glycolic acid, lactic acid, malic acid, oxalic acid, saliclylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid. 3-hydroxy salicylic acid, 3,5-dihydroxy salicylic acid, gallic acid, gluconic acid, pyrocatechol, pyrogallol, tannic acid and salts thereof.

15. The aqueous slurry of claim 8 wherein the complexing agent comprises at least one of acetic acid, citric acid, ethyl acetoacetate, glycolic acid, lactic acid, malic acid and oxalic acid.

16. The aqueous slurry of claim 8 wherein the complexing agent is citric acid.

* * * * *